(12) United States Patent
Baker (10) Patent No.: US 8,946,566 B2
(45) Date of Patent: Feb. 3, 2015

(54) HETEROGENEOUS ENCAPSULATION

(71) Applicant: Apple Inc., Cupertino, CA (US)

(72) Inventor: John J. Baker, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 77 days.

(21) Appl. No.: 13/646,610

(22) Filed: Oct. 5, 2012

(65) Prior Publication Data

US 2014/0098505 A1 Apr. 10, 2014

(51) Int. Cl.
 *H01L 23/28* (2006.01)
(52) U.S. Cl.
 USPC ............................................ 174/524; 174/521
(58) Field of Classification Search
 CPC ................................................... H01L 23/3121
 USPC ......................................... 174/521, 382, 524
 See application file for complete search history.

(56) References Cited

U.S. PATENT DOCUMENTS

| | | | | | |
|---|---|---|---|---|---|
| 4,542,260 | A | * | 9/1985 | Pearce | 174/524 |
| 6,326,544 | B1 | * | 12/2001 | Lake | 174/546 |
| 6,534,711 | B1 | * | 3/2003 | Pollack | 174/529 |
| 6,552,263 | B2 | * | 4/2003 | Farquhar et al. | 174/521 |

* cited by examiner

*Primary Examiner* — Hung V Ngo
(74) *Attorney, Agent, or Firm* — Kilpatrick Townsend & Stockton LLP (57) ABSTRACT

An improved method for producing a PCB assembly requiring at least two different encapsulants is disclosed. The PCB assembly may have two or more separate regions in which electronic devices are attached. In each region, a unique encapsulant with different mechanical, electrical, physical and or chemical properties is used according to the particular requirements of the electronic devices in that region.

21 Claims, 5 Drawing Sheets

HETEROGENEOUS ENCAPSULATION

BACKGROUND OF THE INVENTION

The present invention relates generally to techniques of encapsulating integrated circuits and other electronic components on a substrate, such as a printed circuit board, to to mechanically, electrically and/or chemically protect the encapsulated components.

Many electronic devices include multiple electronic components attached to a substrate, such as a printed circuit board (PCB). The PCB or other type of substrate provides a base that supports the electronic components, including integrated circuits, electronic subassemblies, capacitors, resistors and the like, and provides connection paths that electrically connect the various components together to form various electrical circuits that are required for a properly functioning electronic device.

In some electronic devices the electronic components are encapsulated with a protective cover that mechanically, electrically and/or chemically protects the encapsulated components. For example, in some electronic devices various electronic components may be encapsulated with an epoxy encapsulant to protect the encapsulated components from environmental hazards including moisture and various chemicals that they may otherwise be exposed to. While a number of different encapsulation techniques have been developed, improvements are desirable.

BRIEF SUMMARY OF THE INVENTION

Embodiments of the invention employ two or more different types of encapsulant to mechanically, electrically and/or chemically protect various electronic components attached to a substrate, such as a printed circuit board, in an electronic device. The different encapsulants may have different mechanical, electrical and physical properties that better protect different components depending on the location of the components on substrate or better protect different portions of the substrate itself. For example, a surface mount connector may have multiple leads that physically and electrically couple the connector to a printed circuit board. The body of the connector may be positioned off the printed circuit board while the leads are soldered to bonding pads on the circuit board. Encapsulant may be used to seal the interface between the connector and the printed circuit board to prevent the ingress of moisture or various chemicals, but the connector may need to be mechanically compliant with the circuit board for one or more reasons. Embodiments of the invention may use a compliant or relatively soft encapsulant, such as a silicone-based encapsulant, to provide the desired seal and environmental protection in this area. In a different area of the printed circuit board, however, a precise pattern of encapsulant may be needed to cover various closely spaced electronic components while leaving other areas of the printed circuit board uncovered with encapsulant. Embodiments of the invention may use an epoxy encapsulant that can be applied with a jet dispenser to provide the intricate encapsulation pattern required.

One embodiment of the invention pertains to an electronic device that includes a substrate and at least first and second electronic components attached to the substrate. The first electronic component is sealed with a first encapsulant and the second electronic component is sealed with a second encapsulant that has mechanical, electrical and/or chemical properties different from mechanical, electrical and/or chemical properties of the first encapsulant. In some embodiments the first encapsulant is a relatively hard and rigid epoxy encapsulant and the second encapsulant is a relatively compliant silicone encapsulant. In some embodiments the substrate can be a printed circuit board, the second component can be an electrical connector and the second encapsulant can extend between a portion of the body of the electrical connector and the printed circuit board.

Another embodiment of the invention pertains to an electronic device that includes at least a first electronic component attached to a first region of the substrate and sealed with a first encapsulant. A second encapsulant that has mechanical, electrical and/or chemical properties different from mechanical, electrical and/or chemical properties of the first encapsulant is formed over a second region of the substrate. In some embodiments the second encapsulant protects the substrate itself or the overall assembly. In other embodiments the second encapsulant protects one or more electronic components attached to the substrate in the second region.

Another embodiment of the invention pertains to an electronic device that includes a printed circuit board, a first set of bonding pads formed on the printed circuit board and a plurality of electronic components attached to a first region of the printed circuit. A first encapsulant covers the first region of the printed circuit board including the first plurality of electronic components. The electronic device further includes an electronic connector that has a housing and a plurality of leads that extend from the housing and are attached to the first set of bonding pads. The connector is positioned off of and attached to the printed circuit board such that an exterior surface of the housing of the electronic connector is spaced apart from a second region of the printed circuit board different than the first region. A second encapsulant that is more compliant than the first encapsulant extends between the exterior surface of the housing to the second region of the printed circuit board and covers the plurality of leads attached to the first plurality of bonding pads. In some embodiments the first encapsulant is an epoxy material and the second encapsulant is a silicone material.

Additional embodiments of the invention pertain to methods of assembling a substrate or printed circuit board assembly. According to one such embodiment, electronic components are attached to a printed circuit board or other type of substrate. A first region of the printed circuit board is sealed with a first encapsulant and a second region of the printed circuit board is sealed with a second encapsulant that has mechanical and chemical properties different from mechanical and chemical properties of the first encapsulant. In some embodiments the first encapsulant is a relatively hard and rigid epoxy encapsulant that is applied over one or more of the electronic components attached to the printed circuit board and the second encapsulant is a relatively compliant silicone encapsulant that is applied between an electrical connector and the printed circuit board and covers a plurality of leads that extend out of the connector and are electrically attached to bonding pads on the printed circuit board. In some embodiments the first encapsulant is an epoxy material and the second encapsulant is a silicone material.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION OF THE INVENTION

Certain embodiments of the present invention relate to substrate assemblies having electronic components attached thereto and encapsulated with a protective encapsulant. The substrate assemblies may be employed in portable electronic devices, such as portable media players, cellular telephones, tablet computers, laptop computers and the like including accessories for such devices, or may be employed in electronic devices that are not traditionally thought of as portable devices such as desktop computers and video displays, among other devices. The substrate employed in the assembly may include any type of substrate used for attaching integrated circuits including a ceramic substrate, a glass substrate, a silicon substrate, a polyimide substrate or a printed circuit board (PCB) among others. Some embodiments of the invention to substrate assemblies, such as PCB assemblies, for electronic devices that include different types of encapsulates, each having different mechanical, electrical and/or chemical properties, on the same PCB assembly as described in more detail below.

Figure 1:
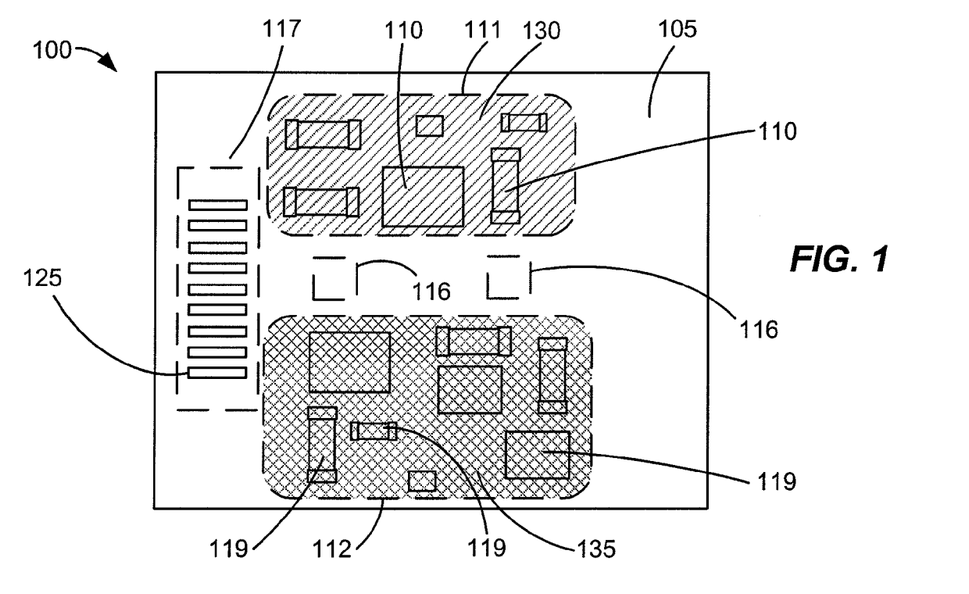
FIG. 1 is a diagram that illustrates a top plan view of a PCB assembly 100 in accordance with an embodiment of the invention.

Certain embodiments of the present invention relate to PCB assemblies employed in electronic devices. Many electronic devices such as smart-phones, media players, tablet computers, and connector adapters may have PCB assemblies containing encapsulated electronic components. FIG. 1 is simplified a top schematic view of an exemplary PCB assembly 100 in accordance with one embodiment of the invention. PCB assembly 100 includes a printed circuit board 105 comprised of, for example, epoxy/glass-fiber/metal, ceramic/metal, polyamide film/metal. PCB 105 may have a portion of outer surfaces that are metallic and designed for the electrical attachment of exemplary electronic components 110 and 119, which may be attached to the PCB in regions 111 and 112, respectively. Attachment of electronic components 110, 119 to PCB 105 may be performed with any electrically conductive material including, for example, solder alloys and conductive adhesive. Myriad processes may be employed to perform the attachment, for example, convective solder reflow, wave soldering and epoxy dispensing/placement/curing. Electronic components 110, 119 may include integrated circuits, electronic subassemblies, electrical connectors, capacitors, resistors and the like.

After electronic components 110, 119 are attached to PCB 105, one or more encapsulants may be dispensed on top of the electronic components, forming a protective barrier around the components. In some embodiments, it may be desirable to encapsulate electronic components 110 in region 111 with an encapsulant that has different mechanical, chemical and/or electrical properties than the encapsulant used to encapsulate electronic components 119 in region 112. For example, electronic components 110 mounted in region 111 of PCB 105 may require different protection than electronic components 119 mounted in region 112. To provide the required protection, two different encapsulants may be employed where region 111 uses a first encapsulant 130 and region 112 uses a second encapsulant 135. The different encapsulants may have different mechanical, electrical and/or chemical properties designed to protect the electronic components 110, 119 and the areas 111, 112 differently. The different mechanical, electrical, chemical and physical properties of encapsulants 130, 135 and exemplary benefits thereof, will be discussed in more detail below.

PCB assembly 100 may have one or more regions, such as regions 116 and 117 shown in FIG. 1, designated as keep out regions where the encapsulant must be kept out of altogether or must not enter until a later stage of assembly. In one embodiment, keep out region 116 may be a feature attached to PCB 105, such as a vertical stand-off that helps keep separation between PCB 105 and an exterior shield or housing of an electronic device that the PCB assembly 100 is positioned within, while region 117 may contain a plurality of bonding pads 125 that need to remain exposed for a subsequent step in which a cable, a flex circuit or other component is bonded to the bonding pads. Thus, in some embodiments, encapsulants 130, 135 may be required to be dispensed carefully and may have the necessary properties to not run or bleed into keep out regions 116 and 117.

Figure 2:
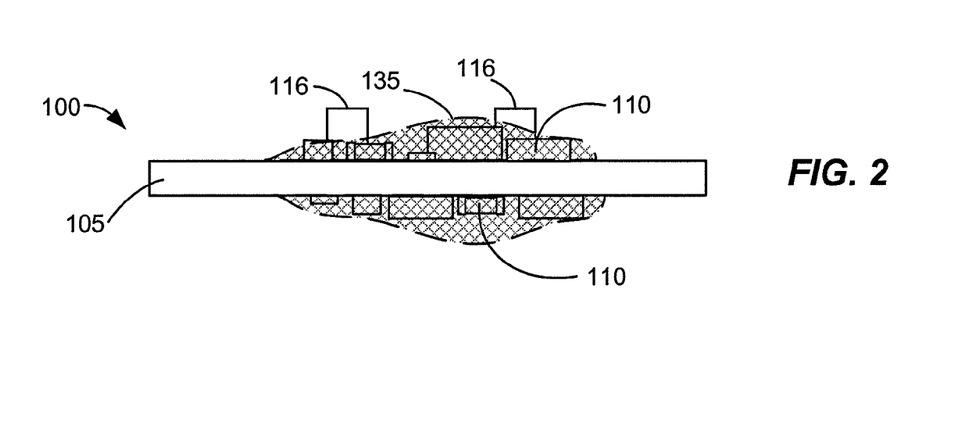
FIG. 2 is a diagram that illustrates a cross-sectional view of PCB assembly 100 shown in FIG. 1.

While FIG. 1 is a top view only of PCB assembly 100 and thus shows only one of the two major sides of PCB 105, the PCB assembly may include electronic components attached to the opposing side of PCB 105 as well. FIG. 2, which is a simplified cross-sectional view of PCB 100 shown in FIG. 1, depicts electronic components formed on each such side and depicts that encapsulants 130, 135 may or may not entirely cover all of electronic components 110, 119. In some embodiments, encapsulants 130, 135 may cover the entirety of all the electronic components 110, 119, whereas in other embodiments the encapsulants may only cover the periphery of the electronic components. Further, encapsulants 130, 135 may be disposed on either or both sides of PCB 105 as shown in FIG. 2.

Figure 3:
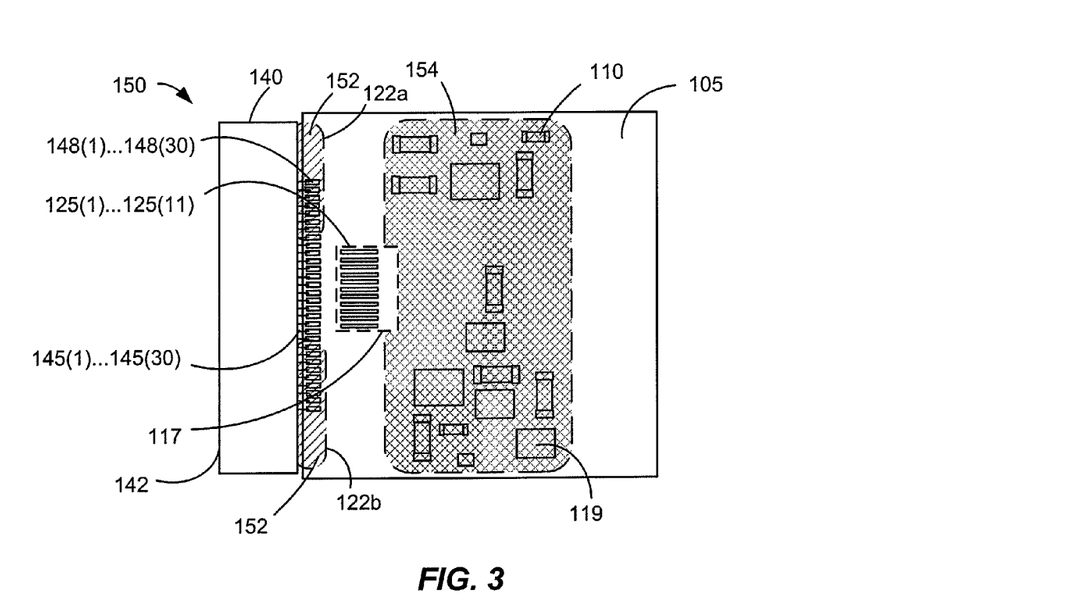
FIG. 3 is a diagram that illustrates a top plan view of a PCB assembly 150 in accordance with another embodiment of the invention in a first partial state of assembly.

FIG. 3 is a simplified top schematic view of a PCB assembly 150 according to another embodiment of the invention at a partial stage of manufacture. PCB assembly 150 can be used in an electronic accessory that is an adapter that allows two electronic devices that include otherwise incompatible connectors to be electrically connected with each other to exchange information. Specifically, the adapter may provide an electrical communication path between first and second electronic devices that could otherwise only communicate via a wireless means. An example of such an adapter is described in U.S. patent application Ser. No. 13/607,519, filed on Sep. 7, 2012, which is hereby incorporated by reference in its entirety.

As shown in FIG. 3, PCB assembly 150 includes two different encapsulants 152 and 154 along with a surface mount receptacle connector 140 with leads 145 that may be attached to a first set of bonding pads 148 on PCB 105. More specifically, surface mount connector 140 may have multiple leads 145 that physically and electrically couple the connector to PCB 105. As shown in FIG. 3, connector 140 is a 30-pin connector that includes thirty leads 145(1) . . . 145(30) and PCB 105 includes a corresponding number of first bonding pads 148(1) . . . 148(30). In other embodiments of the invention, PCB assembly 150 may include a connector 140 with a different number of leads, fewer or more than thirty, and include a set of bonding pads 148 with a number of bonding pads equal to or different than the number of leads.

Connector 140 further includes a body 142 that has a surface spaced apart from PCB 105 in a vertical, horizontal or both vertical and horizontal direction. Body 142 defines a cavity in which a plurality of contact structures are positioned. Each contact structure has a contact tip exposed within the cavity to make electrical connection to a corresponding contact in a mating plug connector and a lead that extends out of the housing and is bonded to one of the plurality of bonding pads as described above. In some embodiments, each contact structure includes a beam portion and an anchor portion (neither of which are shown) between the contact tips and leads.

Figure 4:
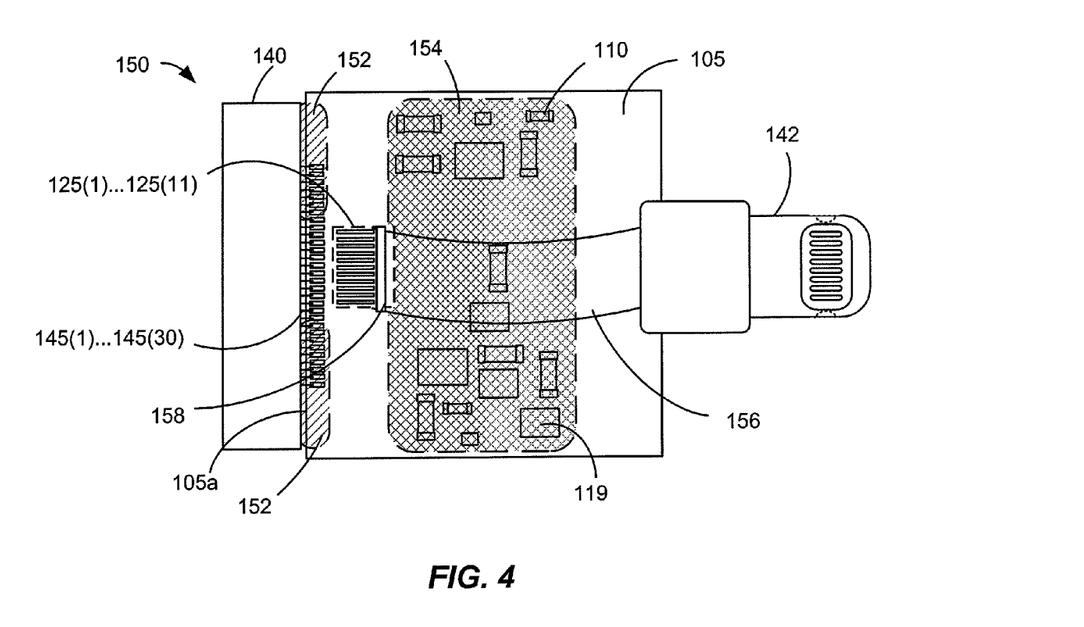
FIG. 4 is a diagram that illustrates a top plan view of PCB assembly 150 shown in FIG. 3 in a second partial state of assembly.
Figure 6:
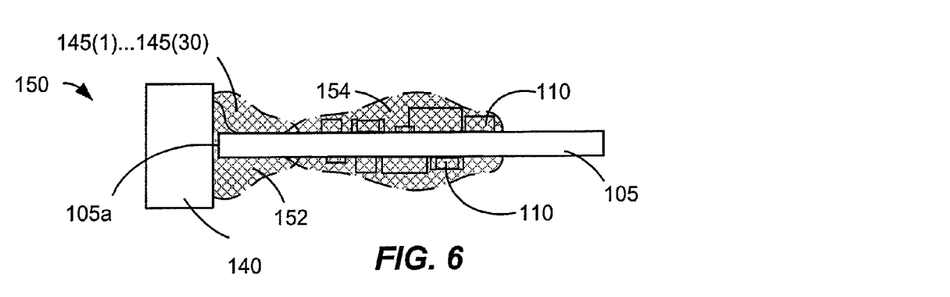
FIG. 6 is a simplified cross-sectional view of PCB assembly 150 in accordance with one embodiment of the invention.

In the embodiment depicted in FIG. 4, the body of connector 140 is positioned off of and spaced apart from PCB 105 in the horizontal direction while leads 145(1) . . . 145(30) may be soldered to bonding pads 148(1) . . . 148(30) on the PCB. Encapsulant 152 may be used to seal the interface between connector 140 and PCB 105 to prevent the ingress of moisture or various chemicals, to strengthen the mechanical connection between the connector PCB 105 and/or to distribute stress or strain. Towards this end encapsulant 152 may extend from a portion of PCB 105 to a surface of connector 140 and may do so from both sides of the PCB as shown in FIG. 6. Some embodiments of the invention allow the connector to remain mechanically compliant relative to the PCB and may use a compliant or relatively soft encapsulant 152 in region 117, such as, for example, a silicone encapsulant which is not easily separable from PCB 105 or connector 140, to provide the desired seal and environmental protection in this area. In other embodiments, encapsulant 152 may be used in any location where, through use of the electronic device that PCB assembly 150 is incorporated into, mechanical forces can be imparted to the assembly to possibly separate one or more components from PCB 105. In the case of PCB assembly 150 and connector 140, such separation may result in dendryte growth on the contacts due to sugars and salts that may travel through cracks in the encapsulant, which in turn may result in thermal failures.

As shown in FIG. 3, in one embodiment PCB 105 includes a second set of bonding pads 125 in a region 117 that must be initially kept free of encapsulant. In this embodiment, encapsulant 152 may first be applied to extend from first and second edge portions 122a and 122b on opposing sides of region 117 to the body of connector 140, covering a portion of an edge 105a of PCB 105 as well as some of leads 145 and bonding pads 148. While bonding pads 125 and 148 are shown as being on the same side of PCB 105 in FIG. 3, in other embodiments of the invention bonding pads 125 and 148 can be on opposite sides of the PCB.

PCB assembly 150 also includes a second type of encapsulant 154 to environmentally seal electronic components 110 and 119. Encapsulant 154 may be an epoxy encapsulant that is harder than and relatively rigid compared to encapsulant 152. The use of a relatively rigid non-compliant encapsulant may be beneficial in particular regions of PCB assembly 150. In some embodiments, encapsulant 154 is a jet dispensable material so that it can be applied with a jet dispenser in a precise pattern to cover certain electronic components while leaving other portions of PCB 105 free from encapsulant. Also, in some embodiments, encapsulant 154 is curable with ultra-violet radiation and heat, is UV fluorescent and does not allow outgassing of halogen elements. In some embodiments, encapsulant 154 has a hardness value of medium hard or higher on the Shore D scale while encapsulant 152 has a hardness value of medium soft or less on the Shore A scale.

As shown in FIG. 3A, PCB assembly 150 includes at least one zone 117 which is kept free of encapsulant. As discussed above, bonding pads 125(1) . . . 125(11) are positioned in zone 117. The bonding pads 125 are kept free of encapsulant at this stage of assembly so that a flex cable (cable 156 shown in FIG. 4) can be bonded to the bonding pads using a hot bar or other suitable bonding operation. Referring now to FIG. 4, which is a simplified top plan view of PCB assembly 150 at a second stage of assembly after the first stage, PCB assembly 150 may include a second, plug connector 142 that physically incompatible with receptacle connector 140 and is attached to PCB 105 using a flexible mount (not shown) that enables connector 142 to flex or bend in multiple dimensions. Further details of a suitable flexible mount can be found in U.S. patent application Ser. No. 13/607,598, filed on Sep. 7, 2012, which is hereby incorporated by reference in its entirety.

Flex cable 156 extends from connector 142 to bonding pads 125(1) . . . 125(11). The end of flex cable 156 opposite connector 142 includes a plurality of connector pads (not shown) that correspond in number and are bonded to bonding pads 125(1) . . . 125(11). In one embodiment, the connector pads and bonding pads are bonded in a hot bar process. Flex cable 156 also includes a conductive spacer 158 that includes a conductive elastomer material and extends upwards from cable 156 in the vertical direction. Conductive spacer 158 can be electrically connected to an outer shield (shield 170 shown in FIG. 8) and provides a dam for additional encapsulant 160 that can be applied in a subsequent assembly step as described below.

Figure 5:
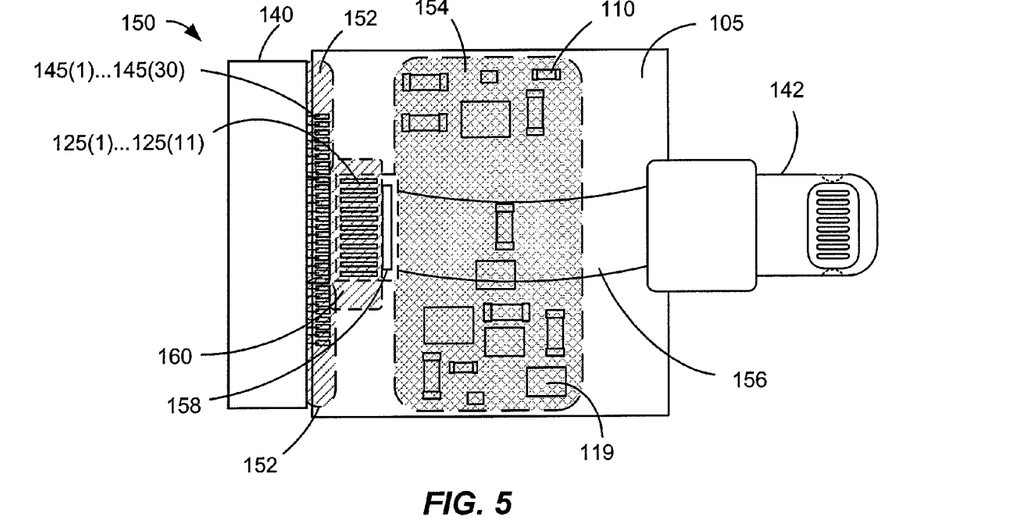
FIG. 5 is a diagram that illustrates a top plan view of PCB assembly 150 shown in FIG. 3 in a third partial state of assembly.

FIG. 5, which is a simplified top plan view of PCB assembly 150 at a third stage of assembly after the second stage, shows additional encapsulant 160 applied over bonding pads 125(1) . . . 125(11) and an end portion of flex cable 156 as well as over any remaining leads 145 and bonding pads 146 not previously covered by encapsulant 152. In one embodiment, encapsulant 160 is a compliant silicone encapsulant and is identical to encapsulant 152.

Figure 7:
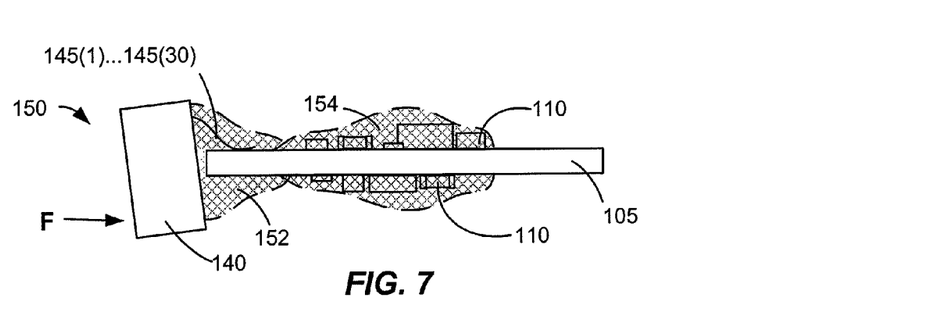
FIG. 7 is a simplified cross-sectional view of PCB assembly 150 shown in FIG. 6 when connector 140 is subject to a lateral force.

In some embodiments, compliant encapsulants 152 and 160 may improve the reliability of the electronic device, as illustrated in FIG. 7. More specifically, connector 140 may be subjected to an exemplary force depicted by "F" and the associated arrow. Thus, connector 140 may be required to flex relative to PCB 105. If a rigid, hard encapsulant were used as encapsulants 152 and/or 160 in this area, PCB 105 or connector 140 may break or crack creating a potential path for the ingress of moisture or various chemicals or the solder connections to leads 145 may crack or break, any of which may in turn cause a subsequent failure of the electronic device.

Figure 8:
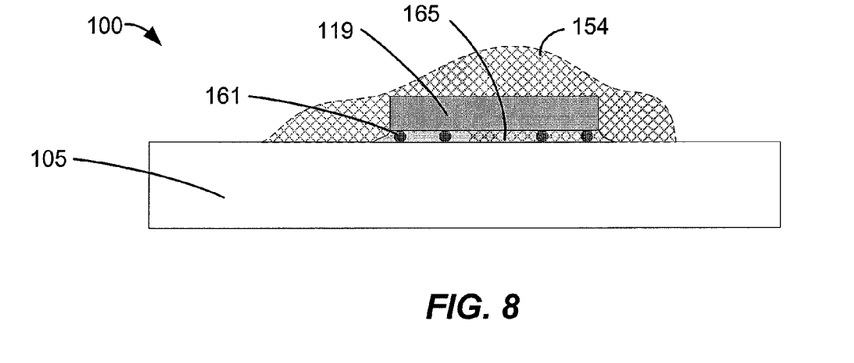
FIG. 8 is a simplified cross-sectional view of a portion of PCB assembly 150 showing an underfill encapsulant applied beneath an electronic component 119 according to an embodiment of the invention.

Some embodiments of the invention include an underfill encapsulant for some or all of electronic components 110 and 119 in addition to the two or more different encapsulants such as encapsulants 152, 154 and 160 described above. To better understand this aspect of embodiments of the invention, reference is made to FIG. 8, which is a cross-sectional view of an exemplary electronic component 119. In FIG. 8 electronic component 119 may be a flip-chip integrated circuit with electronic leads 161 that may be attached to PCB 105. Encapsulant 154 is depicted as covering the entirety of electronic device 119. An optional underfill encapsulant 165 is also shown between electronic component 119 and PCB 105. Other electronic components 110 and 119 may have a similar underfill encapsulant applied under them. In one embodiment, encapsulants 154, 165 both have a relatively high modulus of elasticity and a coefficient of thermal expansion that may be roughly close to the coefficient of thermal expansion of electronic component 119. However, in other embodiments, the encapsulants may have different mechanical properties, for example, their mechanical properties may more closely match those of the PCB 105. Encapsulants 135, 165 may strengthen, stiffen and restrict flexure of PCB 105 in the local region of electronic component 119. Encapsulants 135, 165 may also add environmental or electrical protection to electronic component 119. In some regions of PCB 105 some embodiments of the invention include underfill encapsulant 165 without covering component 119 with another encapsulant.

Figure 9:
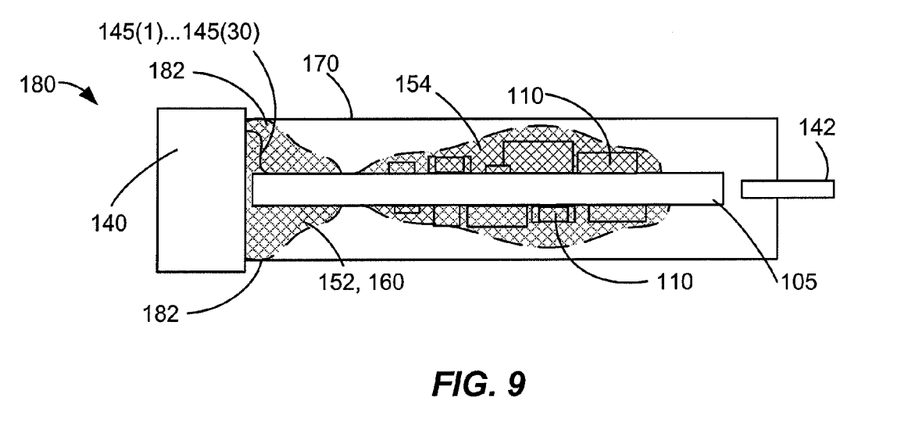
FIG. 9 is a diagram that illustrates a cross-sectional view of a PCB assembly 180 in accordance with another embodiment of the invention.

Further embodiments, depicted in FIG. 9, may involve placing a metallic shield 170 over at least a portion of a PCB assembly 180. Metallic shield 170 may have interference regions 182 where the shield may interfere or come in contact with encapsulant 152, 160. In some embodiments encapsulant 152, 160 may be compliant, easily deforming when shield 170 is engaged. In other embodiments, encapsulant 152, 160 may be designed with a relatively slow curing rate that may allow it to be in a partially cured state having a low modulus of elasticity and a higher modulus of elasticity after fully curing. Such an encapsulant provides a window in which shield 170 can be assembled and attached to PCB assembly 180 prior to encapsulant 152, 160 being fully cured. This, in turn, allows the encapsulant to be pressed towards PCB 105 by the shield in interference regions 182 further improving the seal between the shield and the encapsulant. Thus, in some embodiments, encapsulant 152, 160 may have a slower curing rate than encapsulant 154 used on PCB 105.

In some embodiments, shield 170 may have a ground connection (not shown) that may interface with keep out region 116 (see FIG. 3). More specifically, region 116 may be required to be completely free of any encapsulant, for the ground connection to make contact with this region. Certain PCB regions such as 112 (see FIG. 3) that are encapsulated may be close to keep out regions. These areas may require encapsulant 154 to be dispensed with precision, which may require encapsulant 154 to have different properties than other encapsulants used on PCB assembly 100. More specifically, some encapsulant dispense processes, for example, jet dispensing, may provide improved control of the encapsulant. However, jet dispensing may require the encapsulant to have a particular formulation of viscosity, thixotropic index and other properties. Further, certain encapsulants, even if dispensed with a syringe and needle, may need to be formulated to minimize bleeding and running to ensure they remain contained in encapsulant regions 111, 112 (see FIG. 3) and do not enter keep out regions 116, 117. Thus, to achieve the required control of the dispensed encapsulants, certain encapsulants may require different formulations as compared to other encapsulants used on PCB assembly 100.

Figure 10:
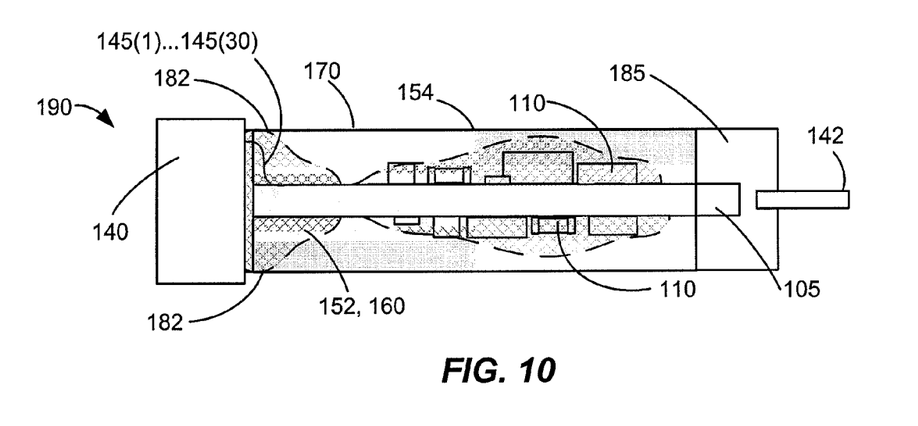
FIG. 10 is a diagram that illustrates a cross-sectional view of a PCB assembly 190 in accordance with yet another embodiment of the invention.
Figure 11:
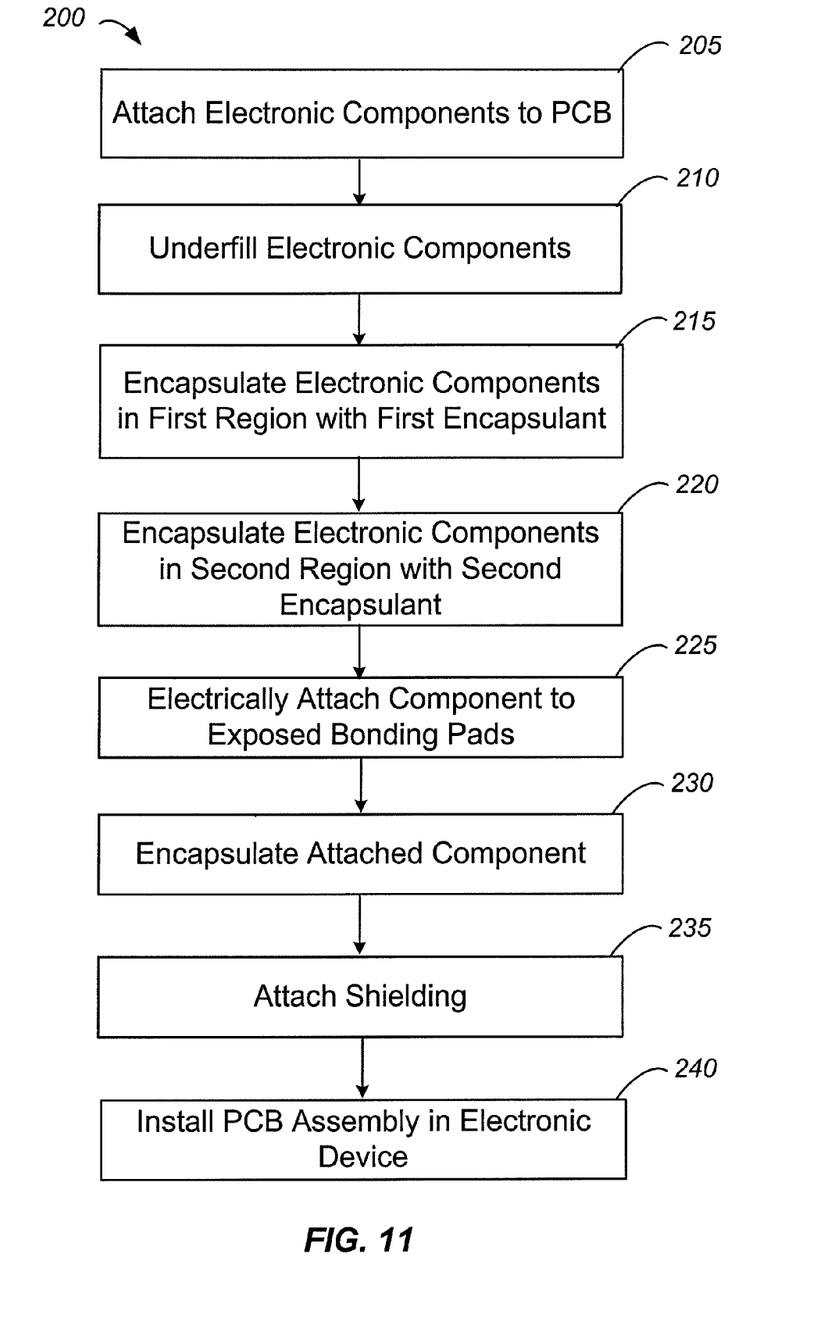
FIG. 11 is a process by which a PCB assembly using two or more encapsulants can be made in accordance with an embodiment of the invention.

Further embodiments, depicted in FIG. 10, may involve a final step of filling some or all of the space between shield 170 and the PCB assembly with a material 185. In some embodiments, an injection molding process may be used where an injection moldable plastic such as, for example, nylon, ABS or PBT may be used. In other embodiments, an injection molding process may be used where an injection moldable mold compound is used such as a phenol-aralkyl type epoxy resin filled with 70% fused silica. In other embodiments, an encapsulant may be used as described above. An encapsulant differs from the injection molding embodiments wherein an encapsulant does not employ injection molding die and the encapsulant is typically dispensed with, for example, a syringe, a jet dispenser, an ultrasonic dispenser, or other similar dispensers.

An exemplary simplified process for manufacturing a PCB assembly comprising electronic components encapsulated with two different materials, in accordance with embodiments described herein, is depicted in FIG. 10. In step 205 one or more electronic components are attached to a PCB or other type of substrate. The electronic components may include integrated circuits, electronic subassemblies, electrical connectors, capacitors, resistors, and the like may be attached, for example, with a solder or a conductive adhesive. The PCB assembly may be cleaned, or may not be cleaned depending on the requirements of the encapsulant and the PCB assembly. In step 215, a first encapsulant with particular chemical, physical, mechanical and electrical properties is dispensed in one or more regions of the PCB and on one or both sides of the PCB to environmentally seal a portion or portions of the PCB. Depending on where the first encapsulant is applied it may cover various electronic components attached to the PCB or it may extend between a component and the PCB to cover an area of potential separation between the two. The encapsulant may then be cured, according to its particular requirements. In step 220, a second encapsulant with different particular chemical, physical, mechanical and electrical properties as compared to the first encapsulant is dispensed in one or more other regions of the PCB on one or both sides of the PCB to environmentally seal another portion or portions of the PCB. Depending on where the second encapsulant is applied it may cover various electronic components attached to the PCB or it may extend between a component and the PCB to cover an area of potential separation between the two. The second encapsulant may then be cured, according to its particular requirements. Additional encapsulants, different from either the first or second encapsulant, may also be applied as appropriate in steps after step 220 or after any of the subsequently described steps prior to the completion of the PCB assembly.

Next, in step 225 a component such as flex cable 160 is bonded to bonding pads on the PCB that were purposefully left uncovered by encapsulant in steps 215 and 220. The component (flex cable) can then be encapsulated with the same encapsulant used to encapsulate other portions of the receptacle connector. In step 235, shield 170 can be attached to the PCB assembly as shown in FIG. 9 and in step 240 the assembly of PCB assembly can be completed and it may be installed in an appropriate electronic device.

In the foregoing specification, embodiments of the invention have been described with reference to numerous specific details that may vary from implementation to implementation. The specification and drawings are, accordingly, to be regarded in an illustrative rather than a restrictive sense. While a number of specific embodiments and examples were disclosed with specific features, a person of ordinary skill in the art will recognize instances where the features of one embodiment can be combined with the features of other embodiments. Also, myriad encapsulants comprising different mechanical, physical, chemical and electrical properties may be used in PCB assembly 100 without departing from the invention. For example, some embodiments may use encapsulants that comprise silicone and may be moisture cured while others may be cured using ultra-violet light. Some embodiments may use encapsulants that comprise an epoxy that may be heat, light or catalyst cured. Some embodiments may use encapsulants that may comprise a filler such as silica, or a ceramic to increase mechanical modulus, reduce the coefficient of thermal expansion and or to increase thermal conductivity. Other embodiments may use encapsulants with high surface free energy designed to wick into small crevices such as between a flip-chip and a PCB. Other embodiments may comprise a combination of encapsulants such as dam and fill where a viscous encapsulant is used to build a dam and a lower viscosity encapsulant is used to fill. Some encapsulants may comprise special formulations to chemically bond to particular components within PCB assembly 105. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. An electronic device comprising:
a substrate having first and second non-overlapping regions;
at least a first electronic component attached to the first region of the substrate, wherein the first electronic component is sealed with a first encapsulant that is an epoxy material;
a second encapsulant formed over the second region of the substrate, the second encapsulant having mechanical, electrical and/or chemical properties different from mechanical, electrical and/or chemical properties of the first encapsulant; and
at least a second electronic component attached to the second region and sealed with the second encapsulant;
wherein the second encapsulant is applied over a plurality of leads extending out of a receptacle connector and electrically attached to circuitry on the substrate.

2. The electronic device set forth in claim 1 wherein the second encapsulant is a silicone material.

3. The electronic device set forth in claim 2 wherein the epoxy material is curable with ultra-violet light and the silicone material is curable using both heat and moisture.

4. The electronic device set forth in claim 1 wherein the first electronic component is an integrated circuit.

5. The electronic device set forth in claim 4 wherein the second encapsulant seals an edge of a body of the receptacle connector to the substrate and covers the circuitry.

6. The electronic device set forth in claim 5 wherein the second encapsulant is a silicone material that is more compliant than the epoxy material.

7. An electronic device comprising:
a substrate having first and second non-overlapping regions;
at least a first electronic component attached to the first region of the substrate, wherein the first electronic component is sealed with a first encapsulant;
a second encapsulant formed over the second region of the substrate, the second encapsulant having mechanical, electrical and/or chemical properties different from mechanical, electrical and/or chemical properties of the first encapsulant; and
at least a second electronic component attached to the second region and sealed with the second encapsulant;
wherein the first electronic component is an integrated circuit and the second electronic component is an electrical connector;
wherein the electrical connector is bonded to circuitry formed on the substrate and the second encapsulant seals an edge of a body of the connector to the substrate and covers the circuitry;
wherein the first encapsulant is an epoxy material and the second encapsulant is a silicone material that is more compliant than the epoxy material; and
wherein the second encapsulant is applied on first and second opposing sides of the substrate and extends between the body of the connector and an edge of the substrate.

8. An electronic device comprising:
a printed circuit board;
circuitry formed on the printed circuit board;
a first plurality of electronic components attached to a first region of the printed circuit;
a first encapsulant covering the first region of the printed circuit board including the first plurality of electronic components;
an electronic connector having a housing and a plurality of leads that extend from the housing attached to the circuitry, wherein an exterior surface of the housing of the electronic connector is spaced apart from a second region of the printed circuit board different than the first region; and
a second encapsulant extending between the exterior surface of the housing to the second region of the printed circuit board and covering the plurality of leads attached to the circuitry, wherein the second encapsulant is more compliant than the first encapsulant.

9. The electronic device set forth in claim 8 wherein the first encapsulant is a silicone material.

10. The electronic device set forth in claim 9 wherein the silicone material is curable using both heat and moisture.

11. The electronic device set forth in claim 9 wherein the second encapsulant is an epoxy material that is less compliant than the silicone material.

12. The electronic device set forth in claim 11 wherein the epoxy material is curable with ultra-violet light.

13. The electronic device set forth in claim 8 further comprising second circuitry formed on the printed circuit board and a second connector coupled to the second circuitry by a flex cable.

14. The electronic device set forth in claim 8 wherein the second circuitry and an end portion of the flex cable are covered by the second encapsulant.

15. The electronic device set forth in claim 8 further comprising a conductive dam bar attached to the flex cable.

16. The electronic device set forth in claim 8 further comprising a metal shield that surrounds the printed circuit board.

17. The electronic device set forth in claim 8 further comprising a second connector that is incompatible with the first connector.

18. An adapter for providing a communication path between first and second electronic devices, the adapter comprising:
a printed circuit board having non-overlapping first, second and third regions;

first circuitry formed in the second region of the printed circuit board;

second circuitry formed in the third region of the printed circuit board;

a plurality of electronic components attached to the printed circuit in the first region;

a first electrical connector having a housing and a plurality of leads that extend from the housing attached to the first circuitry, wherein an exterior surface of the housing of the electronic connector is spaced apart from the second region of the printed circuit board;

a second electrical connector attached to the printed circuit board;

a flex cable coupled between the second electrical connector and the second circuitry;

an epoxy encapsulant covering the first region of the printed circuit board including the first plurality of electronic components; and a silicone encapsulant covering the second and third regions of the printed circuit board including the first and second circuitry.

19. The adapter set forth in claim 18 wherein:

the first connector is a receptacle connector having a body that is spaced apart from the printed circuit board;

the plurality of leads extend from the body over an edge of the printed circuit board to the first circuitry; and the silicone encapsulant extends from the second region of the printed circuit board to the body covering the edge of the printed circuit board.

20. A method of forming a substrate assembly comprising:

attaching a plurality of electronic components to a substrate;

sealing a first region of the substrate with a first encapsulant; and sealing a second region of the substrate with a second encapsulant that has mechanical and chemical properties different from mechanical and chemical properties of the first encapsulant;

wherein the substrate is a printed circuit board; and wherein the first encapsulant is a relatively hard and rigid epoxy encapsulant that is applied over one or more of the electronic components attached to the printed circuit board and the second encapsulant is a relatively compliant silicone encapsulant that is applied between an electrical connector and the printed circuit board and covers a plurality of leads that extend out of the connector and are electrically attached to circuitry on the printed circuit board.

21. A method of forming a substrate assembly comprising:

attaching a plurality of electronic components to a substrate;

sealing a first region of the substrate with a first encapsulant;

sealing a second region of the substrate with a second encapsulant that has mechanical and chemical properties different from mechanical and chemical properties of the first encapsulant; and attaching a metallic shield around at least a portion of the printed circuit board and filling space between the shield and the printed circuit board with an injection molded plastic;

wherein the substrate is a printed circuit board.

* * * * *